(12) United States Patent
Mortensen et al.

(10) Patent No.: US 9,181,087 B2
(45) Date of Patent: Nov. 10, 2015

(54) FLAT BACK PLATE

(75) Inventors: Dennis Mortensen, Frederiksberg C (DK); Pirmin Hermann Otto Rombach, Kongens Lyngby (DK)

(73) Assignee: Epcos AG, Munich (DE)

( * ) Notice: Subject to any disclaimer, the term of this patent is extended or adjusted under 35 U.S.C. 154(b) by 288 days.

(21) Appl. No.: 13/038,459

(22) Filed: Mar. 2, 2011

(65) Prior Publication Data

US 2012/0225259 A1    Sep. 6, 2012

(51) Int. Cl.
*B81C 1/00* (2006.01)
*B81B 3/00* (2006.01)
*H04R 19/00* (2006.01)

(52) U.S. Cl.
CPC ........... *B81C 1/00666* (2013.01); *B81B 3/0078* (2013.01); *H04R 19/005* (2013.01); *B81B 2201/0257* (2013.01); *B81C 2201/0167* (2013.01); *Y10T 29/41* (2015.01); *Y10T 428/24802* (2015.01); *Y10T 428/249921* (2015.04); *Y10T 428/25* (2015.01)

(58) Field of Classification Search
None
See application file for complete search history.

(56) References Cited

U.S. PATENT DOCUMENTS

| | | | |
|---|---|---|---|
| 6,859,542 B2 * | 2/2005 | Johannsen et al. | 381/174 |
| 7,146,014 B2 * | 12/2006 | Hannah | 381/92 |
| 7,851,247 B2 | 12/2010 | Shih | |
| 2004/0227668 A1 * | 11/2004 | Sievenpiper | 343/700 MS |
| 2005/0189635 A1 * | 9/2005 | Humpston et al. | 257/678 |
| 2007/0291964 A1 * | 12/2007 | Chien et al. | 381/174 |
| 2009/0243004 A1 * | 10/2009 | Lan et al. | 257/415 |

FOREIGN PATENT DOCUMENTS

WO    2010/092399 A2    8/2010

* cited by examiner

*Primary Examiner* — Gerard Higgins
*Assistant Examiner* — Sathavaram I Reddy
(74) *Attorney, Agent, or Firm* — Nixon Peabody LLP

(57) ABSTRACT

The present invention refers to a flat back plate, e.g. for MEMS capacitors e.g. for MEMS microphones. For that the back plate comprises a tensile element that exerts a horizontal tensile stress on its environment.

6 Claims, 4 Drawing Sheets

Transverse Plane

Transverse Plane

Transverse Plane

Transverse Plane

Transverse Plane

Sagittal Plane

FLAT BACK PLATE

FIELD OF THE INVENTION

The present invention refers to back plates, e.g., plates that are used as electrodes of capacitors.

BACKGROUND OF THE INVENTION

In general, capacitors comprise two electrodes and a dielectric material between the electrodes. The dielectric material may be an insulator, ceramic or a gas. Capacitors may be used in MEMS devices such as MEMS microphones (MEMS=micro electro mechanical system), MEMS sensors or MEMS switches.

The capacitance of a capacitor having flat electrodes depends on the area of the electrodes, the dielectric material and the distance in between. It is often preferred that one or both electrodes are flat, such, that the distance between the electrodes is well controlled. That is, the electrodes should be flat and arranged in parallel.

MEMS capacitors can be assembled by complementary metal-oxide-semiconductor (CMOS) processing methods. WO 2010/092399 refers to a MEMS microphone comprising MEMS capacitors and methods for production of MEMS capacitors that are compatible with standard CMOS processing techniques. U.S. Pat. No. 7,851,247 B2 refers to methods of fabricating MEMS microphone structures comprising a metal interconnect layer on a dielectric layer.

However, the application of CMOS production steps often results in an uncontrollable mechanical stress in the assembled electrodes of a MEMS capacitor.

MEMS microphones usually comprise a stiff back plate as a first electrode and a compliant membrane as a second electrode. The compliant membrane may oscillate due to differences in air pressure of an acoustical signal. As a result of this oscillation the distance between the electrodes varies correspondingly. Thus, an acoustical signal can be converted into an electrical signal by evaluating the varying capacity of the MEMS capacitor.

The problem of conventional CMOS compatible produced back plates is a mechanical stress in the assembled back plate. Using CMOS compatible material the mechanical stress is, in general, compressive and thus the back plate structure bends or buckles in an uncontrollable manner. Then, the distance between membrane and back plate becomes uncontrollable. As a result of this, the performance of the microphone is degraded.

BRIEF SUMMARY OF THE INVENTION

It is an object of the present invention to provide a flat back plate that can use backend layers of CMOS processes. Such a flat back plate will allow to construct a MEMS capacitor having a well-defined—i.e. controllable—distance between the back plate and the respective other electrode. With regards to MEMS microphones a MEMS capacitor having a well-defined distance between the back plate and the microphone's compliant membrane can be obtained.

It is a further object of the present invention to provide a method for manufacturing such improved flat back plates.

For that the present invention provides a flat back plate and a method of manufacturing a flat back plate according to the independent claims. Dependent claims provide advantageous embodiments of the invention.

In one embodiment the back plate comprises a tensile element that exerts a horizontal tensile stress onto its environment, e.g., if fixed to an anchor means at least with two points near the edge of the back plate. The back plate is preferably fixed to the anchor means at two opposing points or, in another embodiment, along its whole perimeter.

The inventors have found that during manufacturing using conventional CMOS processes compressive mechanical stress in an according back plate is created. This mechanical stress may be due to different temperature dependent elastic components of the respective processed materials. As a result of the mechanical stress in the released structure the back plate bends or buckles in an uncontrollable manner and the distance between two electrodes, e.g. between a membrane and a back plate of a MEMS capacitor, is uncontrollable. As a result, the performance of an according microphone is reduced.

As a solution to this problem a tensile element that exerts a horizontal tensile stress onto its environment i.e. onto respective anchor means is provided. Such a tensile element will result in a flat back plate.

Here, the phrase "horizontal direction" denotes a direction that is parallel to the back plate.

As a result of this property of the tensile element the effects of compressive stress within the back plate are reduced or even eliminated. Thus, the back plate exhibits less buckling. The performance of a corresponding microphone is improved.

In one embodiment the back plate comprises a plurality of tensile elements.

Each tensile element changes the stress conditions in the back plate. The tensile stress density of the back plate should not exceed a certain stress value which could destroy the back plate itself. By distributing the tensile effect over a plurality of tensile elements the maximum stress density within the back plate can be reduced. Preferably the tensile elements are regularly distributed over the area of the back plate. As a result, a flat and reliable back plate is obtained that offers good performance when used in MEMS microphones.

It is possible that the tensile element has the shape of a rectangle, a pentagon, a hexagon or a polygon.

In one embodiment the back plate comprises a plurality of tensile elements that are arranged in a hexagonal or rectangular pattern. Such patterns help to create a uniform tensile stress level within the back plate.

The tensile elements can have a rod shaped structure. The rod shaped tensile elements can be arranged in a pattern representing the edges of one or of a plurality of rectangles, pentagons, hexagons or polygons. It is possible that mainly the whole area of the back plate is covered by connected polygons. It is, however, possible that the tensile elements are arranged to establish one rectangle, pentagon, hexagon or polygon only.

In one embodiment the back plate comprises a plurality of tensile elements that are interconnected directly or via attaching elements. As a result a back plate is obtained in which all tensile elements establish a grid that exerts a tensile stress on the whole back plate. The attaching elements can comprise a metal or non-metallic elements that interconnect the tensile elements and that are arranged between the tensile elements or in layers above or below the tensile elements.

In one embodiment the back plate comprises a plurality of tensile elements that are arranged in a first layer and that are interconnected via attaching elements that are arranged in a second layer above or below the first layer. By arranging the tensile elements and the attaching elements in different layers of the back plates standard CMOS, processing techniques can be applied where the material of the tensile elements and of the attaching elements differ. Thus, a greater flexibility in choosing the respective materials is obtained.

Further, the designer of a respective back plate has an increased degree of freedom in designing the tensile stress or the tensile stress density within the back plate.

In one embodiment the tensile element or the plurality of the tensile elements comprise W (tungsten).

The inventors have found that W which is compatible with most CMOS processes, has a stiffness that is high enough to stabilize the back plate that would bend or buckle without further means like the tensile elements. Further, W has ideal elastic constants, the temperature dependency of which counteracting the compressive stress of respective other materials used in the CMOS back-end layers. In other words: Inserting W comprising tensile elements within a MEMS back plates results in a flat back plate resulting in a MEMS microphone having better performance.

In one embodiment the back plate comprises attaching elements which comprise Al (aluminum), $SiO_2$ (silicon dioxide), or $Si_3N_4$ (silicon nitrate).

The back plate can comprise other metal or alloys, too.

Al, $SiO_2$ or $Si_3N_4$ are materials that are compatible and widely used within CMOS processing techniques. However, these materials appear to produce compressive forces when they are used to establish a MEMS back plate. The combination of these materials with tensile elements comprising W allows to design the back plate in the CMOS back-end layers. Such back plates can be fabricated in parallel and simultaneously with CMOS electronic circuitry. Thus, such flat back plates offer high performance when integrated in a MEMS microphone. Further, such flat back plates can be assembled in an easy and cost efficient manner.

In one embodiment the back plate comprises a plurality of e.g. rod shaped tensile elements each having a length between 1 µm and 10 µm and a width between 0.5 µm and 3 µm.

Further, the tensile elements can have a lengths between 5 µm and 10 µm and a widths between 0.5 µm and 1.5 µm or between 0.5 µm and 2 µm.

These dimensions result in a back plate where the sum of the tensile stress yields a flat back plate that is in spite of the tensile stress not prone to destruction due to raptures within the back plate.

A method of manufacturing a flat back plate comprises the steps:
providing a carrier substrate, and
structuring a plurality of tensile elements and attaching of the tensile elements on the surface of the substrate.

The steps of structuring and attaching can be performed simultaneously.

The tensile elements themselves can establish the back plate. However, it is possible that the tensile elements are embedded within a matrix material. Then, the back plate is established by the combination of the tensile elements and the matrix material in which the tensile elements are embedded.

The carrier substrate can become a part of the back plate. However, it is possible that the back plate is produced onto the carrier substrate and the carrier substrate and the back plate are separated after the essential steps of creating the back plate are completed. For that it is possible to arrange a sacrificial layer between the carrier substrate and the later back plate structures and to remove the sacrificial layer after completing the back plate.

The tensile stress can be designed by arranging onto the substrate the tensile elements in a semi-connected or connected manner according to a predefined grid pattern joint by aluminum layers located in between the tensile elements. By manipulating the mechanical stress in the back plate unwanted buckling or bending can be reduced or prevented.

In one embodiment the tensile elements can represent via elements within a plurality of layers that form the back plate.

The tensile elements can be arranged in a bricklayer pattern in which the brick shaped tensile elements overlap each other. Such a pattern creates a semi-connected mesh joint by in between Al layers. Fully connected W meshes in honeycomb or other patterns can be used as well.

BRIEF DESCRIPTION OF THE DRAWINGS

The present invention will become fully understood from the detailed description given here in below and the accompanying drawings. In the drawings.

DETAILED DESCRIPTION OF THE INVENTION

Figure 1:
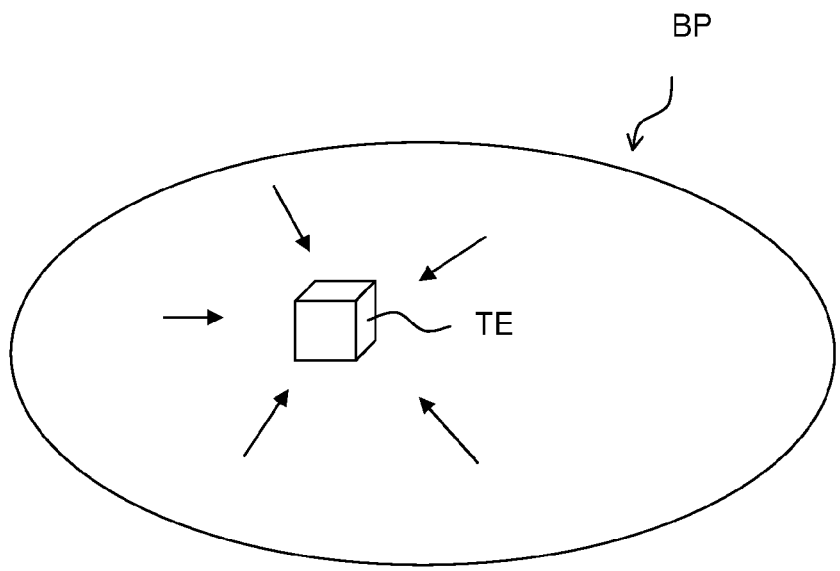
FIG. 1 shows a back plate comprising a tensile element.

FIG. 1 shows a perspective view onto a back plate BP comprising a tensile element TE. The tensile element TE exerts a tensile stress. The tensile stress—as indicated by arrows—points at the tensile element TE of the back plate BP within a vicinity of the tensile element TE. Thus, the tensile element TE pulls the adjoining material of the back plate BP and, thus, the total back plate is pulled into a flat shape. This is in contrast to back plates with compressive stress that tends to buckle.

A flat back plate BP results in a controllable distance between the back plate BP and the compliant membrane of a MEMS microphone. As a result, the performance of a respective MEMS microphone is improved.

Figure 2A:
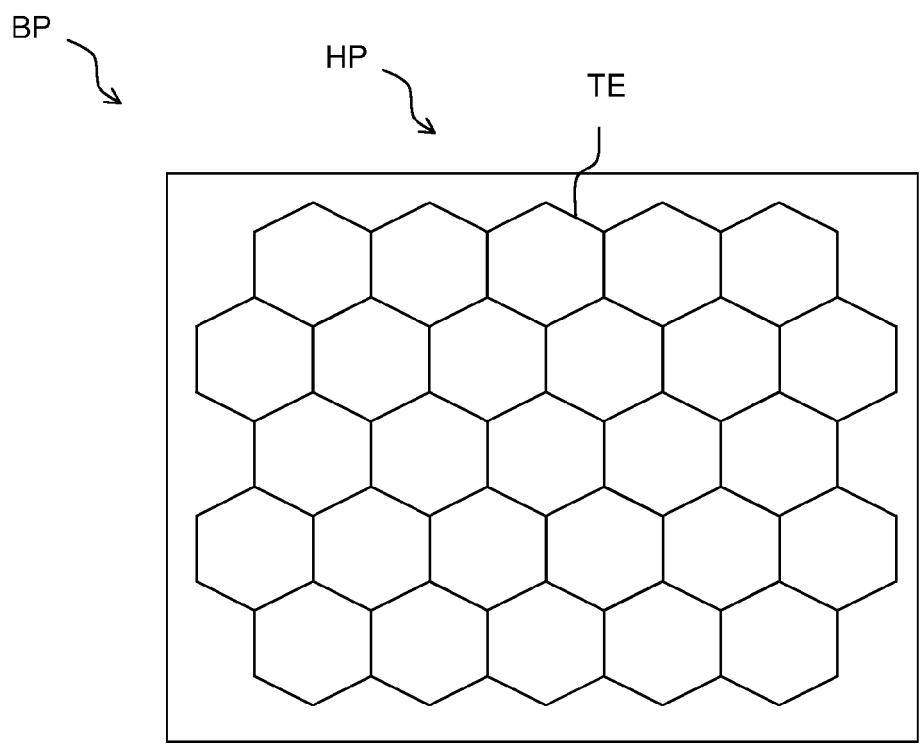
FIG. 2a shows a back plate comprising tensile elements being arranged in a hexagonal pattern.

FIG. 2a shows a transverse plane (top view) of a section of a back plate BP. The back plate BP comprises rod shaped tensile elements TE. The tensile elements TE are arranged in a hexagonal pattern HP. Such a pattern is advantageous because the density of the tensile stress is distributed over the whole back plate BP and areas of very high tensions which may result in raptures does not appear.

Figure 2B:
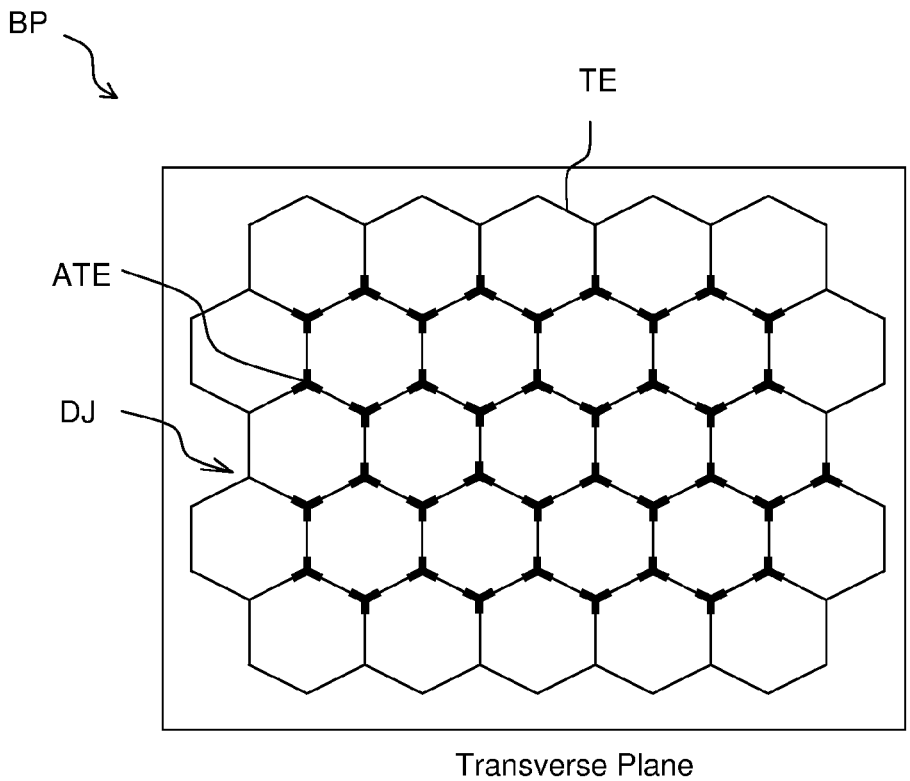
FIG. 2b shows a back plate comprising tensile elements and attaching elements being arranged in a hexagonal pattern.

FIG. 2b shows a transverse plane (top view) of a back plate BP where a plurality of tensile elements TE are interconnected either by direct joints DJ or by attaching elements ATE that shown only schematically in the figure.

Figure 3A:
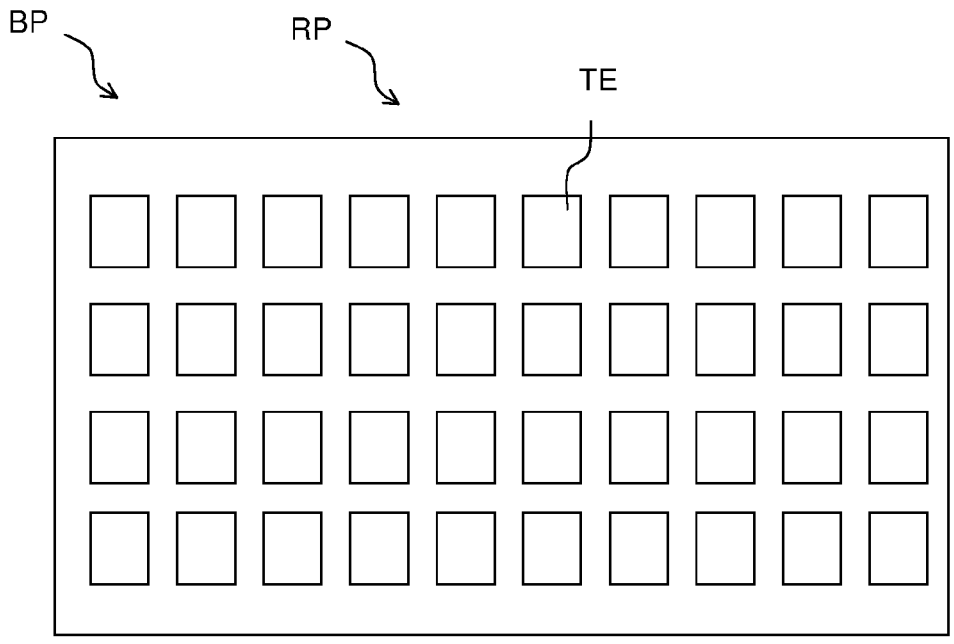
FIG. 3a shows a section of a back plate comprising tensile elements being arranged in a rectangular pattern, FIG. 3b show a section of a back plate comprising tensile elements being arranged in different layers, FIGS. 4a, b show cross sections of back plates.

FIG. 3a shows a transverse plane (top view) of a back plate BP where tensile elements TE are arranged in a rectangular pattern RP.

Figure 3B:
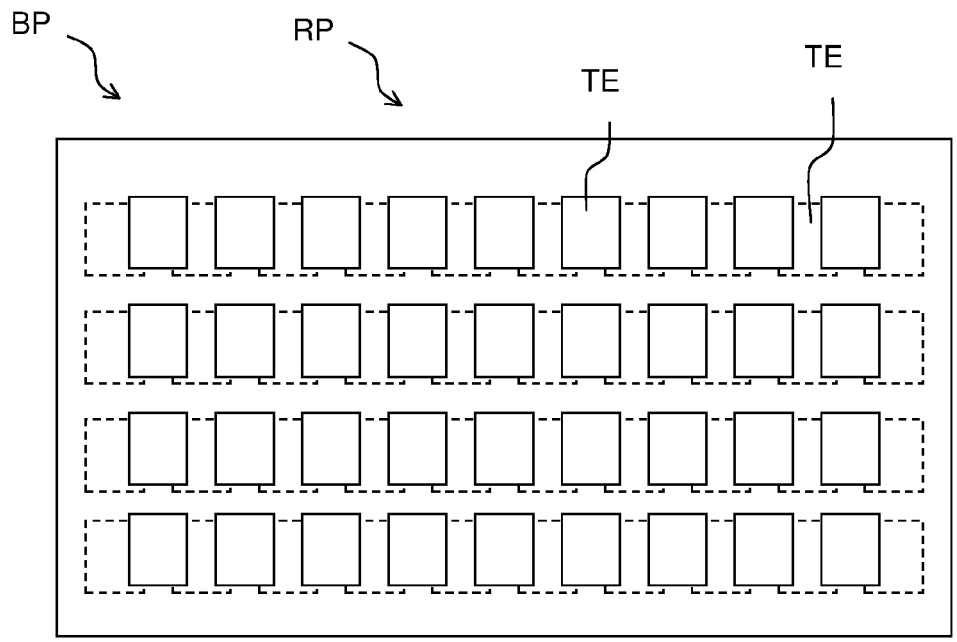

FIG. 3b shows a transverse plane (top view) a back plate BP where the back plate comprises two layers of tensile elements TE. The tensile elements TE depicted with a solid outline are arranged in a layer above another layer comprising tensile elements TE depicted with a dashed outline. The tensile elements TE are arranged in such a manner that the elements of one layer overlap with the gaps between the elements of the respective other layer.

Back plates with 3, 4, 5, 6, 7, 8, 9 or 10 layers of tensile elements are also possible. The overlap of tensile elements arranged in two adjacent layers TE may alternate from layer to layer. It is also possible to shift the tensile elements of one or more layer relative to an adjacent layer in a direction vertical to the shown embodiment or in any other direction.

Figure 4A:
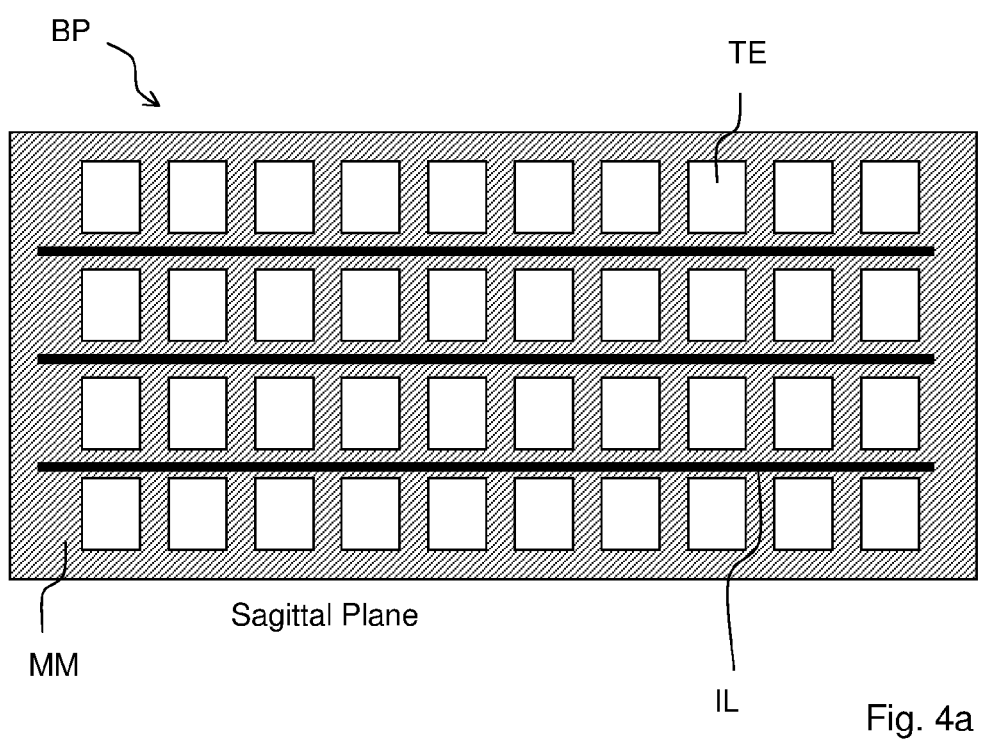

FIG. 4a shows a sagittal plane (cross-section) of a back plate BP where tensile elements TE are arranged in a rectangular pattern. The back plate BP comprises a material MM that establishes a matrix in which the tensile elements TE are embedded in. The back plate BP further comprises intermediate layers IL that are arranged between layers comprising tensile elements TE. The embodiment shown in FIG. 4 comprises four layers of tensile elements TE and, accordingly, three intermediate layers IL that are respectively arranged between two neighbored layers comprising tensile elements. The intermediate layer IL may comprise Al, other metals, alloys, $SiO_2$ or $Si_3N_4$.

Adjacent tensile elements TE of different layers are arranged one above the other and can be vertically aligned.

Figure 4B:
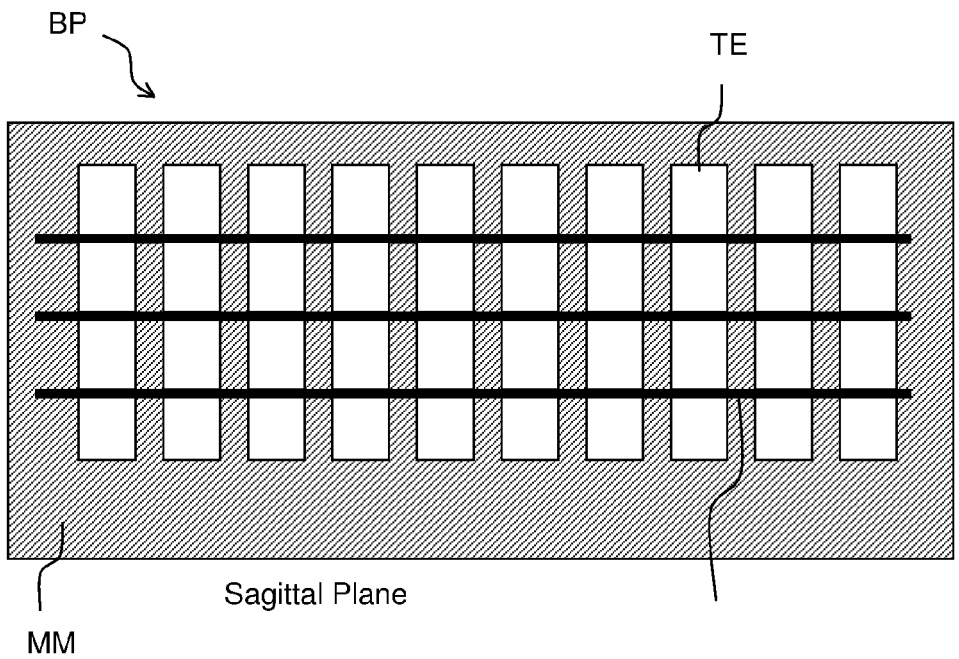

The tensile elements may or may not be directly attached to the respective intermediate layer IL. FIG. 4b shows an embodiment where—in contrast to FIG. 4a—the tensile elements TE are directly attached to the respective intermediate layer IL.

Figure 5:
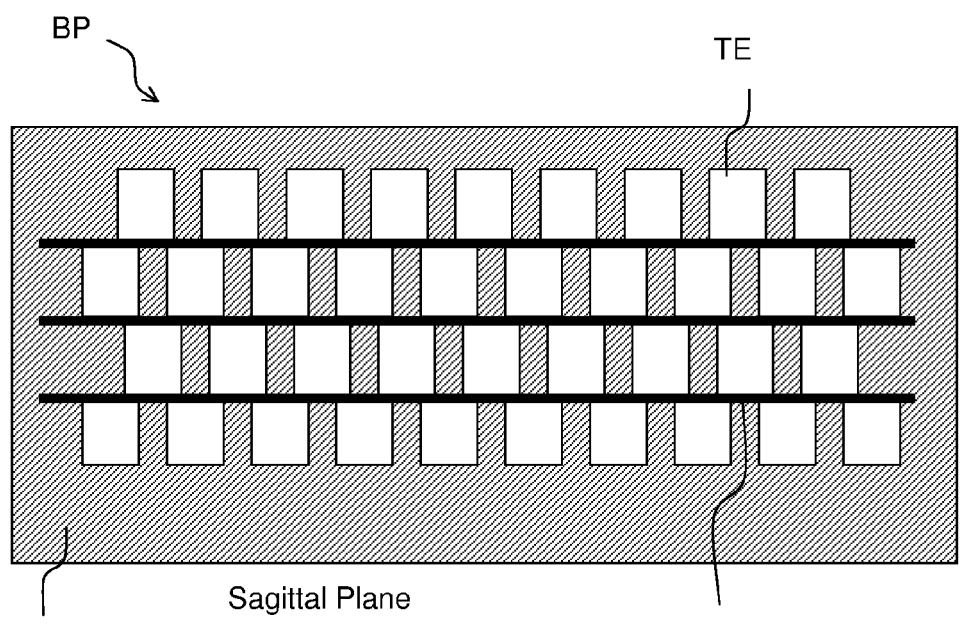
FIG. 5 shows a cross section of a back plate.

FIG. 5 shows a sagittal plane (cross section) of back plates BP. Tensile elements TE of the back plates BP are embedded in a matrix material MM. Intermediate layers IL are arranged between layers comprising the tensile elements. The tensile elements are directly attached to the respective intermediate layers IL. The tensile elements TE are offset with respect to respective tensile elements of neighboring layers. The offset can be arbitrary. However, it is possible that the offset is chosen in such a way that the tensile elements of one layer overlap the gaps between the tensile elements of the respective adjacent layers.

The back plate can be perforated. Perforations are not shown in the figures.

The present invention refers to back plates comprising one or more tensile element. The basic concept does, however, not depend on the number of tensile elements or on details concerning the arrangement of the tensile elements within the back plate. The invention is not restricted by the embodiments of the accompanied figures. Especially embodiments comprising further elements, layers or materials are also possible. Thus, numerous variations departing from the figures are possible without departing from the invention.

What is claimed is:

1. A microelectromechanical system (MEMS) microphone, including a back plate and a compliant membrane forming a MEMS capacitor between the back plate and the compliant membrane, the back plate including a matrix material, a plurality of tensile elements embedded in the matrix material, and attaching elements, wherein the plurality of tensile elements are arranged in a pattern in the transverse plane of the back plate, the plurality of tensile elements being directly interconnected via the attaching elements, the attaching elements including a metal, the plurality of tensile elements exerting a horizontal tensile stress onto their environment, each one of the plurality of tensile elements having a length between 1 µm and 10 µm and a width between 0.5 µm and 3 µm and including a metal.

2. The MEMS microphone of claim 1, where the pattern is a hexagonal or rectangular pattern.

3. The MEMS microphone of claim 1, wherein the plurality of tensile elements are arranged in a first layer and are interconnected via the attaching elements that are arranged in a second layer above or below the first layer.

4. The MEMS microphone of claim 1, where each of the plurality of tensile elements comprises tungsten.

5. The MEMS microphone of claim 1, wherein the metal of the attaching elements includes aluminum, metals other than aluminum, or metal composite alloys.

6. The MEMS microphone of claim 4, wherein the metal of each of the attaching elements is aluminum.

* * * * *